United States Patent [19]

Savas

[11] Patent Number: 4,506,198

[45] Date of Patent: Mar. 19, 1985

[54] TRIGGER SPEED CONTROL SWITCH

[75] Inventor: Charles R. Savas, Huntsville, Ala.

[73] Assignee: Eaton Corporation, Cleveland, Ohio

[21] Appl. No.: 413,598

[22] Filed: Aug. 31, 1982

[51] Int. Cl.³ .......................................... H02K 27/20
[52] U.S. Cl. .................................. 318/301; 318/305;
318/345 C; 318/345 G
[58] Field of Search ...................... 310/64, 58, 52, 50;
29/846, 852, 829, 589, 585; 200/267, 287, 292;
318/305, 345 C, 345 G, 345 H, 345 D, 301;
339/17 R, 17 B, 17 C

[56] References Cited

U.S. PATENT DOCUMENTS

| 2,599,710 | 6/1952 | Hathaway | 29/846 |
| 3,132,982 | 5/1964 | Grimsinger | 29/829 X |
| 3,271,601 | 9/1966 | Raver | 310/58 X |
| 3,427,715 | 2/1969 | Mika | 29/846 X |
| 3,484,632 | 12/1969 | Opalenik et al. | 318/345 G |
| 3,522,486 | 8/1970 | Johns et al. | 361/398 |
| 3,536,973 | 10/1970 | Matthews et al. | 318/345 H |
| 3,650,706 | 3/1972 | Parsons | 29/829 X |
| 3,761,788 | 9/1973 | Matthews et al. | 318/345 |
| 3,775,576 | 11/1973 | Brown | 200/157 |
| 4,074,419 | 2/1978 | Hanni et al. | 29/846 |
| 4,095,072 | 6/1978 | Piber | 310/50 X |
| 4,097,704 | 6/1978 | Piber | 310/50 X |
| 4,137,490 | 1/1979 | Brozoski et al. | 318/345 G |
| 4,205,434 | 6/1980 | Brozoski et al. | 29/860 |
| 4,241,297 | 12/1980 | Piber et al. | 310/50 X |
| 4,241,298 | 12/1980 | Trammell, Jr. et al. | 318/345 D X |

Primary Examiner—Ulysses Weldon
Attorney, Agent, or Firm—C. H. Grace; L. G. Vande Zande

[57] ABSTRACT

A variable resistor (44) and conductors (36,38,42,46) for the speed control circuit are printed on a flexible insulating film (28) held against a flat heat sink (24) in an upright plane by a deflected conductive tab (34) protruding within an aperture (30) in the film pressed over the anode of a thyristor (26) soldered to the heat sink (24). The resistance (44) and collector (46) elements of the variable resistor are formed on a flap (32) which is folded over in a horizontal plane to present uniformly disposed surfaces for engagement by a trigger-carried wiping contactor (54). A chip capacitor (48) is soldered to conductive segments (36,38) of the printed circuit.

11 Claims, 5 Drawing Figures

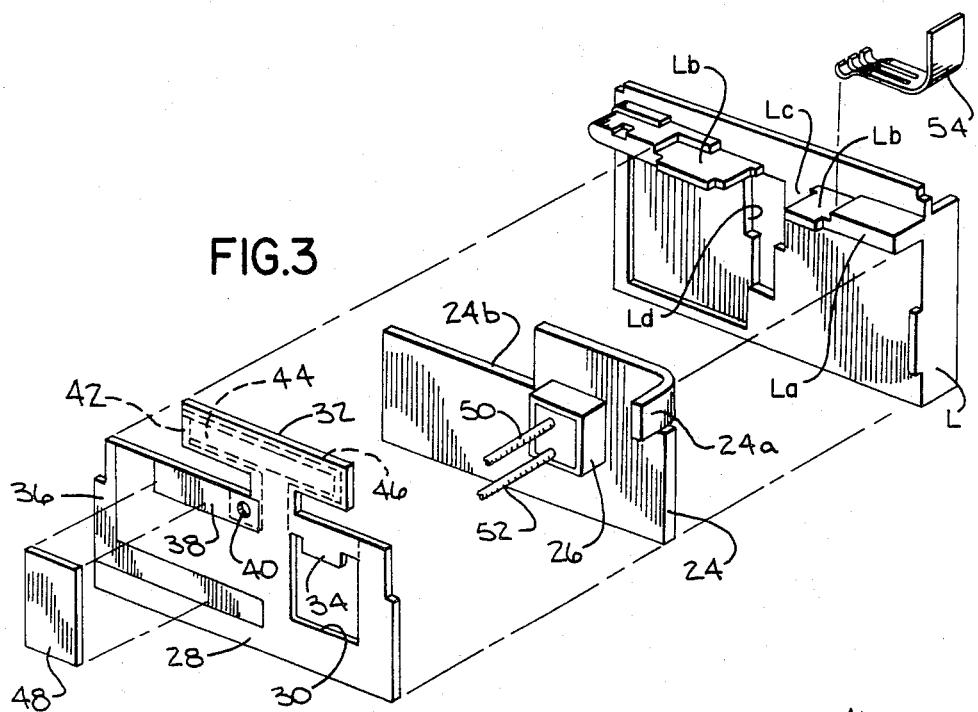
FIG.3
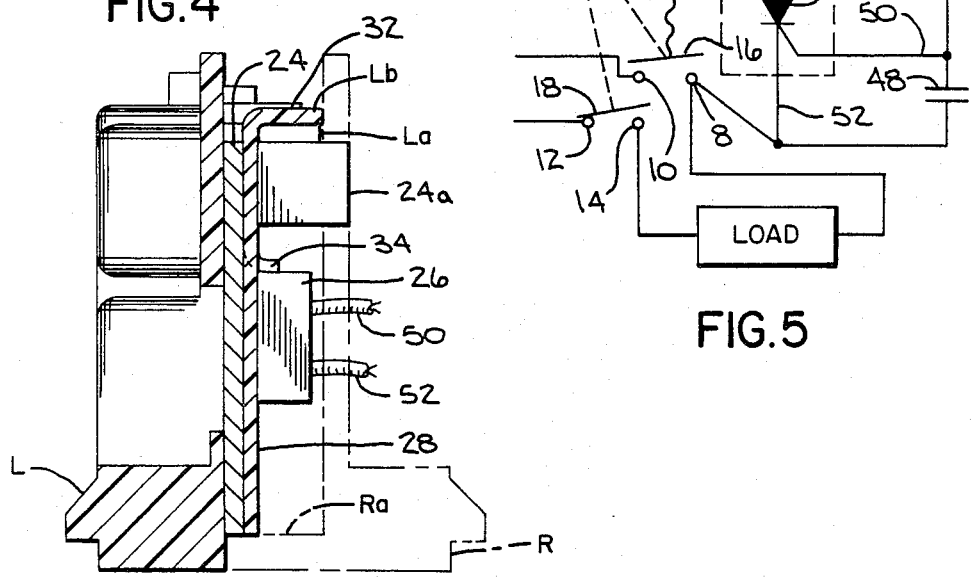
FIG.4
FIG.5

TRIGGER SPEED CONTROL SWITCH

BACKGROUND OF THE INVENTION

This invention relates to switches which control the speed of an electric motor in response to the position of the switch operator. More particularly this invention relates to trigger switches which are usually mounted in the handle of a portable electric appliance or tool and are operated by the index finger of the hand holding the appliance or tool to vary the speed of the electric motor thereof. Such switches generally comprise a depressible trigger member which upon initial depression operates to close switch contacts within the switch housing to connect the device to an electrical source, and upon further or subsequent depression operates a variable resistor to change the amount of resistance present in a speed control circuit contained within the housing. The speed control circuit comprises a thyristor and a heat sink therefore as well as a capacitor connected with the variable resistor to provide an RC timing circuit for controlling the thyristor. A switch of the foregoing type is a disclosed and claimed in U.S. Pat. No. 3,775,576 issued Nov. 27, 1973, to H. W. Brown, and assigned to the assignee of this invention, the disclosure of which is incorporated herein by reference.

A major consideration in providing switches of the aforementioned type is the ability to readily and economically assemble the components which comprise the speed control circuit. The comparatively small space available within the switch housing for packaging the components which comprise the speed control circuit and the amount of heat generated by the thyristor of that circuit requires the heat sinking capabilities to be highly efficient. The durability and reliability of the speed control circuit for such switches is significantly improved when the number of hand soldered wired connections between the components is minimized, thereby to also reflect an economic advantage in fabricating the speed control circuit. U.S. Pat. Nos. 4,137,490 issued Jan. 30, 1979 and 4,205,434 issued June 3, 1980, both to D. J. Brozoski et al and both assigned to the assignee of this invention disclose trigger speed control switches wherein the anode of a thyristor chip is soldered directly to the heat sink to provide highly efficient thermal conduction as well as an economically advantageous and reliable mechanical connection for the thyristor. These patents also disclose an improved method of attaching a capacitor chip to the speed control circuit and to the gate and cathode of the thyristor for reliable operation and economic assembly advantages. However, in each of the aforementioned patents the variable resistor comprises a separate resistor strip which is positioned in the housing along side, but spaced from, a collector which is an extension of the heat sink. A brush contactor carried by the trigger bridges the resistor and collector strip to vary the resistance in the speed control circuit according to the depth of trigger depression. Imperfections occurring in the manufacture of the resistor strip or in the formation of the collector or in mounting either of these elements within the switch housing can lead to undue and uneven wear of the brush contactor, resistor or collector elements. Manufacturing processes which attempt to hold closer tolerances for these elements increase the cost thereof. Accordingly while these prior switches have been useful for their intended purposes, the subject invention provides improvements thereover.

SUMMARY OF THE INVENTION

This invention relates to a trigger speed control switch wherein the components comprising the speed control circuit are arranged and assembled in an economical and reliable manner.

This invention further provides a trigger tool handle switch wherein the resistor and collector elements of a variable resistor are formed on a printed circuit for improved uniformity between the two members along their length to thereby improve the engagement thereof with a bridging brush contactor.

The invention further provides a trigger tool handle switch having a flexible printed circuit which is mechanically retained and electrically connected to a thyristor and heat sink assembly by resilient means on the flexible printed circuit which are deflected upon assembly.

The invention and its advantages will become apparent in the following description and claims when read in conjunction with the accompanying drawings.

BRIEF DESCRIPTION OF THE DRAWINGS

FIG. 3 is an exploded isometric view of the speed control components of the switch of this invention;

FIG. 4 is a cross sectional view of the speed control components of this invention taken substantially along the line 4—4 in FIG. 2; and FIG. 5 is a schematic circuit diagram of the speed control trigger switch of FIGS. 1-4 and of its connection to a load.

DESCRIPTION OF THE PREFERRED EMBODIMENT

Figure 1:
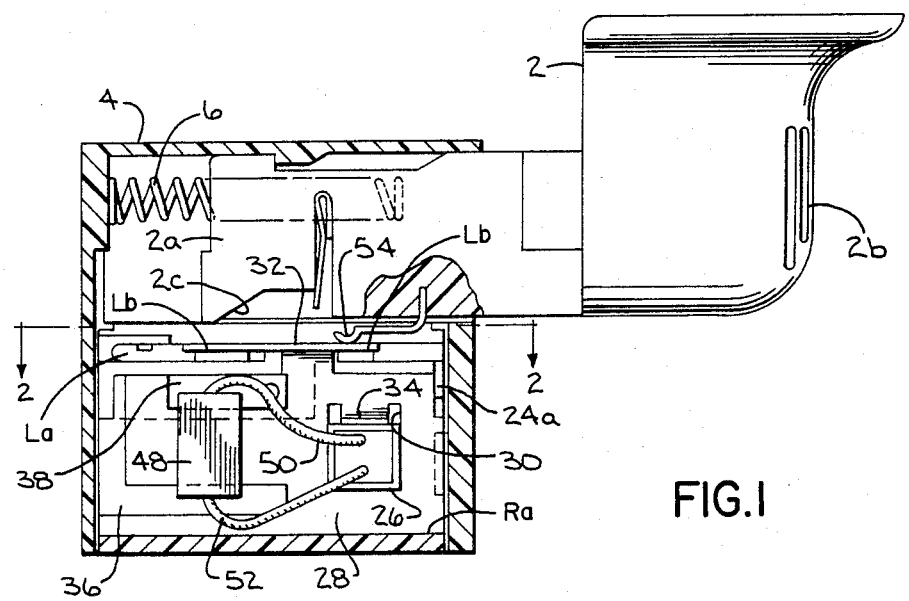
FIG. 1 is a side view of the switch of this invention with the trigger shown substantially in elevation and the frame of the switch housing broken away along the line 1—1 in FIG. 2.
Figure 2:
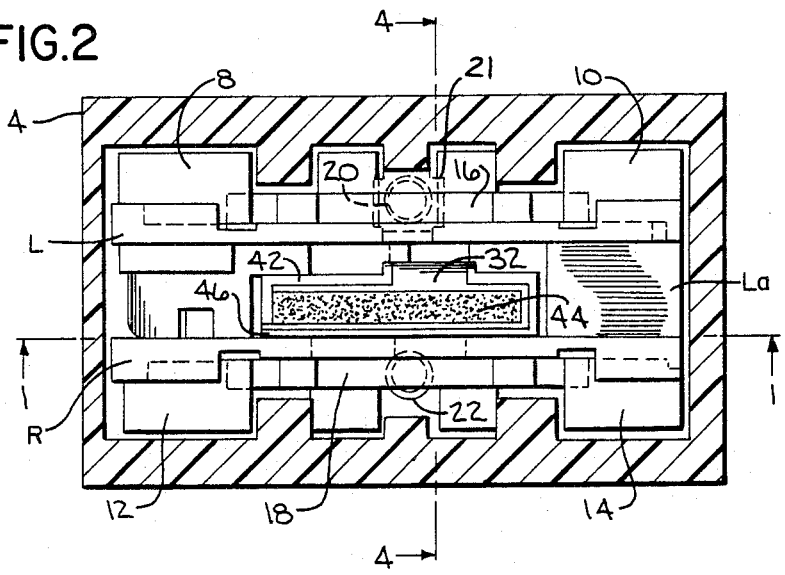
FIG. 2 is a cross sectional view taken along the line 2—2 in FIG. 1.

Referring to FIGS. 1-4, there is shown a self-enclosed trigger speed control switch constructed in accordance with the invention. As shown therein, the switch comprises a spring-biased trigger 2 mounted for linear sliding movement in a switch housing. The housing comprises a frame 4 and a pair of base halves designated as left base L and right base R, respectively (FIG. 2). The left base half L is shown isometrically in FIG. 3. The base halves L and R are configured to be positioned together in abutting relationship and inserted into the frame from the open bottom thereof to be clamped together by the frame 4. The frame 4 and inserted base halves L and R also function to locate the interior end 2a of trigger 2 such that the finger engaging portion 2b extends outwardly of the switch housing under the basis of helical spring 6.

To form a center compartment for the speed control elements of the switch, the left base half L is provided with an upper ledge La and the right base half R is provided with a lower ledge Ra (FIGS. 1 and 4), each abutting the other base half when the two base halves are clamped together by the frame, as shown in more detail in the referenced H. W. Brown U.S. Pat. No. 3,775,576. Ledge La is located a short distance below the top of base half L to provide a defined shelf Lb for a variable resistor as will be described hereinafter. The base halves L and R are provided with cooperating means holding them in registration with one another and within frame 4 to prevent relative movement in a vertical plane while the surrounding frame 4 prevents lateral separating movement of the base halves.

While not shown in detail herein, the outboard surfaces of base halves L and R are provided with suitable formations which locate stationary switch contacts 8, 10 and 12, 14, respectively, as disclosed in the aforereferenced U.S. Pat. No. 3,775,576. Movable contacts 16 and 18 are provided in each base half L and R, respectively, for cooperative bridging engagement with the stationary contacts 8, 10 and 12, 14, respectively. The movable contacts 16 and 18 are biased into bridging engagement with their respective stationary contacts by helical compression springs 20 and 22 and are cammed out of engagement with respective ones of these stationary contacts by cams such as 2c (FIG. 1) formed on the bottom side of trigger portion 2a.

As mentioned previously the housing halves L and R interengage to provide a central cavity which receives the speed control components for the switch. Referring specifically to FIG. 3, a heat sink 24 is positioned under the ledge La against the inboard side of base half L. The heat sink is made of electrically conducting metal having good thermal conducting qualities such as tin-plated copper and forms the anode terminal for a silicon controlled rectifier (SCR) chip 26 which has its anode soldered to the heat sink 24. The heat sink 24 rests on lower ledge Ra of base half R upon final assembly. A tab 24a, formed at right angles with respect to the major plane of heat sink 24, is provided as a connection point for optional electrical add-on features for the switch, e.g. electrical feedback. Base half L is provided with a window opening Ld through which a conductive cap 21, interposed between spring 20 and movable contact 16, makes electrical connection with the back surface of heat sink 24.

A printed circuit is provided on a flexible insulating sheet 28 such as Mylar film or the like. Sheet 28 is essentially rectangular in shape having a rectangular aperture 30 at one end thereof and a T-shaped flap 32 projecting from the upper edge thereof. A tab 34 extends downwardly into the opening from the upper edge of aperture 30. A first conductive segment 36 is formed on the front face of insulating sheet 28 as viewed in FIG. 3. A second conductive segment 38 is also formed on the front face of sheet 28 and spaced from segment 36. At the right-hand end of segment 38, a hole 40 is provided through the insulating sheet 28. A conductive segment 42 is formed on the backside of insulating sheet 28 directly opposite the right hand end of segment 38 and in alignment with hole 40. With further reference to the orientation of the printed circuit in FIG. 3, the shape of segment 42 at the backside of insulator sheet 28 is defined as extending upwardly along the left-hand edge of the vertical bar of T-shaped tab 32, left along the lower edge of the left-hand portion of the horizontal bar of the T-shaped tab 32 and then extending upwardly along the left-hand end of the horizontal bar. The conductive material forming segments 38 and 42 flows into the hole 40 and lines the edges thereof to electrically interconnect these two segments. A resistor segment 44 is printed on the backside of flap 32 to extend along the horizontal bar thereof. The resistor segment 44 is electrically connected to the segment 42 at the left-hand end of the bar, but is spaced from the remainder of segment 42 and from a third conductive segment 46 also printed on the backside of the insulator sheet 28. Segment 46 extends along the upper edge of the horizontal bar of flap 32, downwardly along the right-hand end thereof and inwardly along the lower edge of the right-hand end of the horizontal bar of flap 32. Segment 46 continues downwardly along the right-hand edge of the vertical bar of T-shaped flap 32 and then extends to the right to include the backside of tab 34.

The printed circuit is assembled against the face of heat sink 24 such that the aperture 30 is forced around the edges of SCR 26, thereby deflecting the tab 34 as shown in FIG. 4. The deflection of tab 34 serves to hold the printed circuit board in position against the face of heat sink 24, and further functions to electrically connect segment 46 of the printed circuit with the anode of SCR 26 and therefore with the heat sink 24. Heat sink 24 is cut away at 24b so as not to electrically engage segment 42. The printed circuit is notched at the upper left-hand corner as viewed in FIG. 3 to permit an electrical connection (not shown) to be made between segment 36 and contact 8. A chip capacitor 48, having a solder paste applied on its back surface at the opposite ends thereof is preferably temporarily positioned against the printed circuit by an adhesive material (not shown) to position the ends of the capacitor 48 to the conductive segments 36 and 38. The gate lead 50 of the SCR 26 is formed over to engage the conductive segment 38 and the upper edge of capacitor chip 48 while the cathode lead 52 of SCR 26 is similarly formed over to engage the conductive segment 36 and the bottom edge of capacitor 48. Leads 50 and 52 are also provided with a solder paste and heat is provided to the capacitor at each end to solder the capacitor and respective leads to the respective conductive segments 38 and 36.

The flap 32 of the printed circuit extends above the ledge La on base half L, the vertical bar of the T-shaped flap extending through a central opening Lc in the ledge La. Flap 32 is folded over such that the horizontal bar of the flap lies upon the shelf surface Lb of the ledge La. To maintain the flap 32 in this folded position, it is preferable to place an adhesive backing (not shown) on the front side of flap 32 for engagement with shelf surface Lb. Trigger 2 carries a brush contactor 54 on the underside thereof. Contactor 54 is trifurcated to provide three independently flexible contact arms and is positioned on the trigger to align one of the contact arms with collector segment 46 and the other two arms with the resistor segment 44 on the flap 32. In operation, depression of trigger 2 carries the brush contactor 54 toward the left in FIGS. 1, 2 and 3 of the drawings to decrease the resistance in the speed control circuit and thereby increase the firing angle for the SCR. The coextensive printed circuit formation of resistor strip 44 and collector strip 46 on the same insulating surface provides for uniform and even contact pressure by the brush contactor 54 throughout its travel, thereby providing for even wear on the contacts and the printed circuit elements.

While the invention has been disclosed herein in a preferred embodiment, it is to be understood that it is not intended to be limited by the particular structure disclosed and is susceptible to various modifications without departing from the scope of the appended claims.

I claim:

1. A speed control switch comprising, in combination:

an insulating housing having switch contacts mounted therein;

an operator mounted for reciprocal movement in said housing and movable to operate said switch contacts;

a wiping contactor carried by said operator; and speed control circuit means for providing a variable output signal responsive to operator position comprising:

a substantially flat heat sink mounted in said housing in edgewise relation to said wiping contactor;

a thyristor having its anode affixed to said heat sink;

an insulating sheet comprising a main body and a flexible flap extending therefrom, said insulating sheet having a printed circuit formed thereon comprising conductive segments extending from said main body along said flexible flap and defining coextensive spaced resistor and collector segments on said flap, said insulating sheet positioned in a face-to-face engagement with a flat surface of said heat sink and said flap being folded over in said housing to a position in flatwise relation to said wiping contactor wherein said wiping contactor bridges said resistor and collector segments for varying the amount of resistance in said speed control circuit in response to operator movement, and a flexible tab formed on said insulating sheet having a conductive extension of said collector segment formed thereon, said tab being deflected against the anode of said thyristor in electrically conductive engagement upon positioning said insulating sheet against said heat sink for electrically connecting said collector segment to said heat sink; and means electrically connecting said printed circuit and said heat sink to said switch contacts.

2. The invention as defined in claim 1 wherein said insulating sheet comprises an aperture through which said thyristor projects and said tab extends from an edge of said aperture for deflected engagement with the anode of said thyristor, an edge of said aperture opposite said tab abutting an opposite side of the anode of said thyristor for effecting deflection of said tab, said tab and said opposite edge of said aperture cooperating for retaining said insulating sheet positioned against said heat sink.

3. The invention as defined in claim 1 wherein said printed circuit is formed on opposite sides of said insulating sheet and said collector segment, said conductive extension of said collector segment and said resistor segment are provided on a side of said insulating sheet positioned adjacent said heat sink.

4. The invention as defined in claim 3 wherein one of said conductive segments extending from said main body along said flexible flap and connected to said resistor segment has conductive portions on both sides of said insulating sheet, and interconnecting means electrically joining said conductive portions.

5. The invention as defined in claim 4 wherein said interconnecting means comprises an aperture in said insulating sheet between said conductive portions, and conductive means within said aperture joining said portions.

6. A speed control switch comprising, in combination:

an insulating housing having switch contacts mounted therein;

an operator mounted for reciprocal movement in said housing and movable to operate said switch contacts;

a wiping contactor carried by said operator; and speed control circuit means for providing a variable output signal responsive to operator position comprising:

a substantially flat heat sink mounted in said housing in edgewise relation to said wiping contactor;

an insulating sheet comprising a main body and a flexible flap extending therefrom, said insulating sheet having a printed circuit formed thereon comprising conductive segments extending from said main body along said flexible flap and defining co-extensive spaced resistor and collector segments on said flap, said insulating sheet positioned in face-to-face engagement with a flat surface of said heat sink and said flap being folded over in said housing to a position in flatwise relation to said wiping contactor wherein said wiping contactor bridges said resistor and collector segments for varying the amount of resistance in said speed control circuit in response to operator movement, means for electrically connecting said collector segment to said heat sink comprising a flexible conductive tab formed on said insulating sheet, means on said heat sink for deflecting said tab when said insulating sheet is positioned in to face-to-face engagement with said heat sink, and means for maintaining said insulating sheet in said face-to-face engagement; and means electrically connecting said printed circuit and said heat sink to said switch contacts.

7. A trigger speed control switch for varying an output signal in response to trigger position comprising, in combination:

an insulating housing having switch contacts mounted therein;

a trigger mounted for movement in said housing and biased to an extended position with respect to said housing, said trigger being depressible for operating said switch contacts;

a brush contactor carried by said trigger;

speed control circuit means in said housing comprising:

a substantially flat heat sink mounted in said housing in edgewise relation to said brush contactor;

a flexible insulating sheet comprising a main body and a flap extending therefrom and having a printed circuit formed thereon comprising conductive segments extending from said main body along said flap and defining co-extensive spaced resistor and collector segments on said flap, said insulating sheet positioned in face-to-face engagement with a flat surface of said heat sink and said flap being folded over in said housing to a position in flatwise relation to said brush contactor, means for electrically connecting said collector segment to said heat sink comprising a conductive tab formed on said flexible insulating sheet, means on said heat sink for deflecting said tab when said insulating sheet is positioned in said face-to-face engagement with said heat sink, and means for maintaining said insulating sheet in said face-to-face engagement; and means electrically connecting said printed circuit and said heat sink to said switch contacts;

wherein said collector segment and said resistor segment are bridged by said brush contactor for varying the resistance of said speed control circuit in response to depression of said trigger.

8. A trigger speed control switch for varying an output signal in response to trigger position comprising, in combination:
   an insulating housing having switch contacts mounted therein;
   a trigger mounted for movement in said housing and biased to an extended position with respect to said housing, said trigger being depressible for operating said switch contacts;
   a brush contactor carried by said trigger;
   speed control circuit means in said housing comprising:
   a substantially flat heat sink mounted in said housing in edgewise relation to said brush contactor;
   a thyristor having its anode affixed to said heat sink;
   a flexible insulating sheet comprising a main body and a flap extending therefrom and having a printed circuit formed thereon comprising conductive segments extending from said main body along said flap and defining coextensive spaced resistor and collector segments on said flap, said insulating sheet positioned in face-to-face engagement with a flat surface of said heat sink and said flap being folded over in said housing to a position in flatwise relation to said brush contactor, and a conductive tab formed on said flexible insulating sheet, said tab being deflected against the anode of said thyristor upon positioning said flexible insulating sheet to said heat sink for electrically connecting said collector segment to said heat sink;
   means electrically connecting said printed circuit and said heat sink to said switch contacts; and
   wherein said collector segment and said resistor segment are bridged by said brush contactor for varying the resistance in said speed control circuit in response to depression of said trigger.

9. The invention as defined in claim 8 wherein said flexible insulating sheet comprises an aperture through which said thyristor projects and said tab extends from an edge of said aperture for deflected engagement with the anode of said thyristor, an edge of said aperture opposite said tab abutting an opposite side of said anode for effecting deflection of said tab, said tab and said opposite edge of said aperture cooperating for retaining said flexible insulating sheet positioned to said heat sink.

10. The invention as defined in claim 8 wherein said printed circuit is formed on opposite sides of said flexible insulating sheet and said collector segment, said conductive tab and said resistor segment are provided on a side of said flexible insulating sheet positioned adjacent said heat sink.

11. The invention as defined in claim 10 wherein said insulating sheet comprises a second portion extending beyond an edge of said heat sink, one of said conductive segments extending from said main body along said flap and connected to said resistor segment has conductive portions on both sides of said second portion of said insulating sheet and means extending through said insulating sheet electrically connecting the opposite sides of said one conductive segment.

* * * * *